(12) United States Patent
Wang et al.

(10) Patent No.: US 12,057,771 B2
(45) Date of Patent: Aug. 6, 2024

(54) VOLTAGE SPIKE MEASUREMENT CIRCUIT AND METHOD

(71) Applicant: Delta Electronics (Shanghai) Co., Ltd., Shanghai (CN)

(72) Inventors: Xiaolei Wang, Shanghai (CN); Peng Zhu, Shanghai (CN); Jianpeng Lin, Shanghai (CN); Haixin Wu, Shanghai (CN); Hao Sun, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 18/468,746

(22) Filed: Sep. 18, 2023

(65) Prior Publication Data

US 2024/0006986 A1    Jan. 4, 2024

Related U.S. Application Data

(62) Division of application No. 17/446,305, filed on Aug. 30, 2021, now Pat. No. 11,804,772.

(30) Foreign Application Priority Data

Sep. 8, 2020    (CN) .......................... 202010936896.X

(51) Int. Cl.
*H02M 1/36* (2007.01)
*G01R 19/04* (2006.01)
(Continued)

(52) U.S. Cl.
CPC .............. *H02M 1/36* (2013.01); *G01R 19/04* (2013.01); *H02M 1/088* (2013.01); *H02M 3/33576* (2013.01); *H02M 3/33584* (2013.01)

(58) Field of Classification Search
CPC .... H02M 1/36; H02M 1/088; H02M 3/33576; H02M 1/0025; H02M 1/342; H02M 3/01;
(Continued)

(56) References Cited

U.S. PATENT DOCUMENTS 4,801,887 A * 1/1989 Wegener ................. H02M 1/36
327/104
5,373,434 A   12/1994 Malik
(Continued)

FOREIGN PATENT DOCUMENTS

CN    101097355 A    1/2008
CN    101272089 A    9/2008
(Continued)

*Primary Examiner* — Yusef A Ahmed
(74) *Attorney, Agent, or Firm* — CKC & Partners Co., LLC

(57) ABSTRACT

A voltage spike measurement circuit for a power switch includes a rectifier unit, a capacitive divider unit and a discharge unit, the rectifier unit configured to receive a voltage signal at both ends of a power switch and output a rectified signal; the capacitive divider unit includes at least two capacitors connected in series and configured to receive the rectified signal, divide the rectified signal based on a capacitance ratio of the at least two capacitors, and output a divider signal to a digital signal processor to calculate a voltage spike measurement value of the power switch; and the discharge unit connected in parallel to the capacitive divider unit.

5 Claims, 13 Drawing Sheets

(51) Int. Cl.
  *H02M 1/088* (2006.01)
  *H02M 3/335* (2006.01)
(58) Field of Classification Search
  CPC .......... H02M 3/33573; H02M 3/33584; G01R 19/04; Y02B 70/10
  See application file for complete search history.

(56) References Cited

U.S. PATENT DOCUMENTS

| | | | | |
|---|---|---|---|---|
| 5,652,480 | A * | 7/1997 | Groiss | H05B 41/28 363/40 |
| 6,301,133 | B1 * | 10/2001 | Cuadra | H02J 1/102 363/65 |
| 6,977,826 | B2 * | 12/2005 | Huang | H02M 3/33507 363/21.18 |
| 7,548,047 | B1 * | 6/2009 | Dasgupta | H02M 3/156 323/283 |
| 8,390,262 | B2 * | 3/2013 | Chang | H05B 45/38 315/250 |
| 8,860,483 | B2 * | 10/2014 | Wang | H03K 7/08 327/175 |
| 9,709,606 | B1 | 7/2017 | Cho | |
| 9,829,515 | B1 | 11/2017 | Cho | |
| 9,843,271 | B1 * | 12/2017 | Nikitin | H02M 1/44 |
| 10,952,299 | B1 * | 3/2021 | Xiong | H02M 1/0058 |
| 10,998,708 | B2 * | 5/2021 | Askan | H02H 1/0007 |
| 11,265,988 | B2 * | 3/2022 | Cheng | H05B 47/26 |
| 2003/0222633 | A1 * | 12/2003 | Hwang | H02M 1/36 323/282 |
| 2006/0050537 | A1 * | 3/2006 | Zeng | H02M 3/33571 363/16 |
| 2008/0084196 | A1 * | 4/2008 | Lacombe | H05B 39/047 323/282 |
| 2009/0001944 | A1 * | 1/2009 | Kim | H02M 3/33507 323/238 |
| 2010/0061126 | A1 * | 3/2010 | Huynh | H02M 3/33507 363/21.12 |
| 2010/0259196 | A1 * | 10/2010 | Sadwick | H02M 3/33515 315/309 |
| 2011/0260625 | A1 * | 10/2011 | Gautam | H05B 45/37 315/250 |
| 2012/0099344 | A1 * | 4/2012 | Adragna | H02M 3/33571 363/21.02 |
| 2012/0294052 | A1 * | 11/2012 | Reddy | H02M 1/36 363/49 |
| 2013/0229829 | A1 * | 9/2013 | Zhang | H02M 3/01 363/16 |
| 2013/0265805 | A1 * | 10/2013 | Kamath | H02M 3/33573 363/20 |
| 2014/0253098 | A1 | 9/2014 | Xu | |
| 2014/0268918 | A1 * | 9/2014 | Gong | H02M 3/33523 363/21.15 |
| 2015/0008895 | A1 * | 1/2015 | Weng | H02M 3/156 323/285 |
| 2015/0229219 | A1 | 8/2015 | Choi | |
| 2015/0280584 | A1 * | 10/2015 | Gong | H02M 3/33592 363/21.13 |
| 2015/0381075 | A1 | 12/2015 | Qu et al. | |
| 2016/0020075 | A1 | 1/2016 | Lemson | |
| 2016/0352231 | A1 * | 12/2016 | Quigley | H02M 1/36 |
| 2016/0380542 | A1 * | 12/2016 | Moon | H02M 1/36 323/235 |
| 2017/0012547 | A1 * | 1/2017 | Jitaru | H02M 3/33592 |
| 2017/0261537 | A1 * | 9/2017 | Chong | G01R 31/3004 |
| 2017/0331373 | A1 | 11/2017 | Huang | |
| 2019/0190398 | A1 * | 6/2019 | Tanioku | H02M 5/4585 |
| 2019/0199194 | A1 * | 6/2019 | Nikitin | H02M 7/53873 |
| 2019/0229616 | A1 * | 7/2019 | Illiano | H02M 3/156 |
| 2019/0341852 | A1 * | 11/2019 | Fahlenkamp | H02M 3/33515 |
| 2020/0099309 | A1 * | 3/2020 | Jin | H02M 3/33592 |
| 2020/0177087 | A1 * | 6/2020 | Warnes | H02M 1/08 |
| 2022/0247404 | A1 * | 8/2022 | Ye | H03K 17/567 |
| 2023/0148160 | A1 * | 5/2023 | Sivakumar | H02H 9/046 361/56 |

FOREIGN PATENT DOCUMENTS

| | | |
|---|---|---|
| CN | 102403712 A | 4/2012 |
| CN | 204302361 U | 4/2015 |
| CN | 102608445 B | 1/2016 |
| CN | 106535391 A | 3/2017 |
| CN | 206498322 U | 9/2017 |
| CN | 105391291 B | 3/2018 |
| CN | 109412417 A | 3/2019 |
| CN | 109921623 A | 6/2019 |
| CN | 109980909 A | 7/2019 |
| CN | 110854835 A | 2/2020 |
| CN | 111130332 A | 5/2020 |
| CN | 111190044 A | 5/2020 |
| CN | 111628657 A | 9/2020 |
| JP | S60126901 A | 7/1985 |
| KR | 101721365 B1 | 3/2017 |

* cited by examiner

VOLTAGE SPIKE MEASUREMENT CIRCUIT AND METHOD

CROSS-REFERENCE TO RELATED APPLICATIONS

The present application is a divisional application divided from U.S. patent application Ser. No. 17/446,305 filed on Aug. 30, 2021, which claims priority of patent application No. 202010936896.X filed in P.R. China on Sep. 8, 2020 under 35 U.S.C. § 119(a), the entire contents of which are hereby incorporated by reference.

Some references, if any, which may include patents, patent applications, and various publications, may be cited and discussed in the description of this disclosure. The citation and/or discussion of such references, if any, is provided merely to clarify the description of the present disclosure and is not an admission that any such reference is "prior art" to the disclosure described herein. All references listed, cited, and/or discussed in this specification are incorporated herein by reference in their entireties and to the same extent as if each reference was individually incorporated by reference.

BACKGROUND OF THE INVENTION

1. Field of the Disclosure

The disclosure relates to the field of switching power supply, and particularly to a startup control method and system for a DC/DC converter, and a voltage spike measurement circuit and method for a power switch.

2. Related Art

In the switching power supply, a voltage spike of a power switch is an important consideration, wherein the power switch may be a diode or a Metal-Oxide-Semiconductor Field-Effect Transistor (MOSFET), for example. Generally, the voltage spike shall be less than the maximum allowable working voltage of the power switch with a certain margin. If the voltage spike exceeds the maximum allowable working voltage, the power switch will have a risk of being damaged. Generally speaking, the switching power supply does not monitor the voltage spike of the power switch in real time. Besides, at the production stage, it is also difficult to test for the voltage spike, so, only a reasonable design can be used to ensure that the voltage spike is below a limit value.

As for the application of electric vehicles, a high-voltage lithium battery is connected to a high-voltage bus through a relay to supply power for on-board equipment such as a motor driver or a heater. Generally, a large number of bus capacitors are connected across the positive and negative poles of the high-voltage bus. Therefore, before the relay is connected, the bus capacitors shall be charged to a voltage of the lithium battery. The on-board DC/DC converter can provide a reverse charging function using the energy of a low-voltage lead-acid battery. When the bus capacitors are charged, a large current of the low-voltage side results in a large voltage spike of the rectifier power switches (power switches at the low-voltage side). In the design phase, a low current of the low-voltage side is often set to ensure the voltage spike of the rectifier power switch does not exceed the limit. Therefore, at the startup stage from a low-voltage side to a high-voltage side, the charging power is limited, and the desired charging time is long.

Besides, with the improvement of the power density, an active clamping circuit is widely applied to reduce the voltage spike of the rectifier power switch in the converter. Generally, before an output voltage is slowly increased, the clamping capacitor shall be pre-charged to a preset platform voltage. Generally, the platform voltage equals a secondary voltage obtained by converting a primary voltage of the high-voltage side via a turn ratio of the transformer. If the clamping capacitor has not been pre-charged, or the pre-charge control accuracy is poor, at the beginning of the soft-start, the power switch in the active clamping circuit will have a large current surge, and the rectifier power switch also may have a large voltage spike.

Therefore, it is urgent to develop a new startup control method for a DC/DC converter, which can largely improve startup efficiency and shorten startup time, while ensuring the voltage stress on the power switch does not exceed a limit.

SUMMARY OF THE INVENTION

The disclosure provides a startup control method and system for a DC/DC converter, and a voltage spike measurement circuit and method for a power switch.

In one aspect, the disclosure provides a voltage spike measurement circuit for a power switch, comprising: a rectifier unit for receiving a voltage signal of a power switch, and outputting a rectified signal; a capacitive divider unit comprising at least two capacitors connected in series, the capacitive divider unit receiving the rectified signal, dividing the rectified signal according to a capacitance ratio of the at least two capacitors, and outputting a divider signal to a digital signal processor to calculate a voltage spike measurement value of the power switch; and a discharge unit connected in parallel to the capacitive divider unit.

In another aspect, the disclosure further provides a voltage spike measurement method for a power switch, comprising: configuring the voltage spike measurement circuit for a power switch; during a turn-off period of the power switch, when a voltage signal of the power switch is reduced from a spike voltage, calculating a voltage spike measurement value of the power switch through the digital signal processor.

The additional aspects and advantages of the disclosure are partially explained in the below description, and partially apparent from the description, or can be obtained through the practice of the disclosure.

BRIEF DESCRIPTION OF THE DRAWINGS

The exemplary embodiments will be described in detail with reference to the accompanying drawings, through which the above and other features and advantages of the disclosure will become more apparent.

DETAILED EMBODIMENTS OF THE INVENTION

Figure 1:
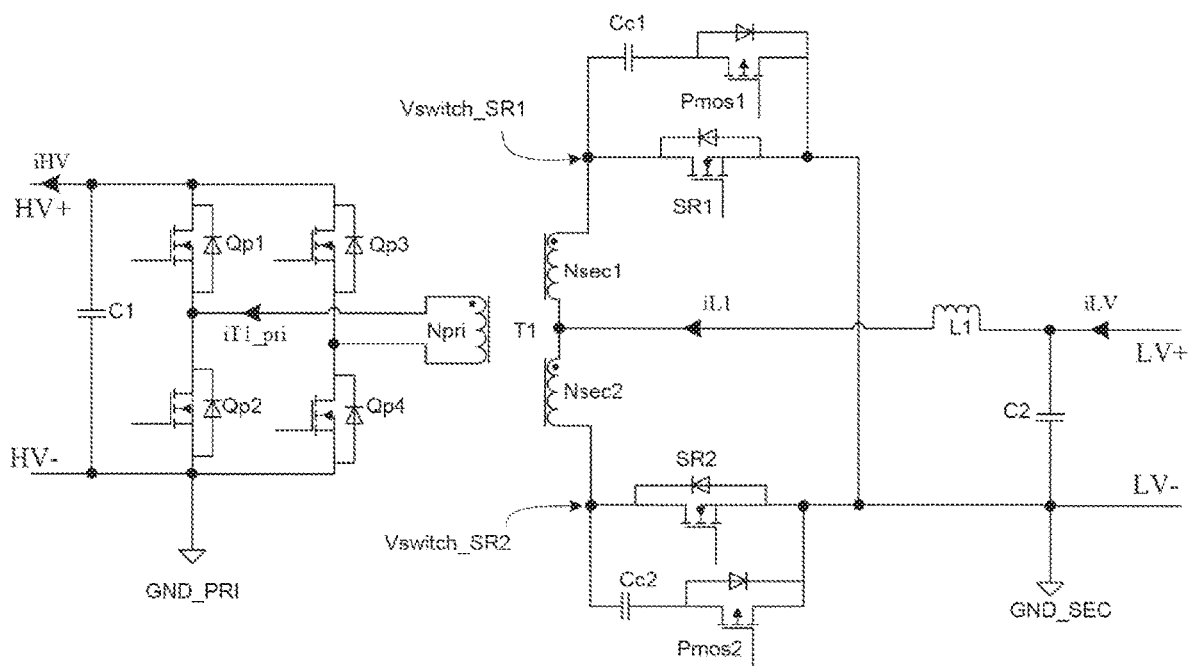
FIG. 1 is a topological diagram of a DC/DC converter according to the disclosure.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this disclosure will be thorough and complete, and the conception of exemplary embodiments will be fully conveyed to those skilled in the art. In the drawings, the same reference sign denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. Also, the terms "first", "second" and the like in the claims are only used as signs, instead of numeral limitations to objects.

An on-board DC/DC converter is taken as an example. FIG. 1 shows a topology for a DC/DC converter of the disclosure, wherein reverse working refers to the delivery of energy from a low-voltage side (i.e., LV side) to a high-voltage side (i.e., HV side), and forward working refers to the delivery of energy from the high-voltage side (i.e., HV side) to the low-voltage side (i.e., LV side). As shown in FIG. 1, the DC/DC converter includes a transformer T1, a primary circuit electrically connected to a primary side of the transformer T1, and a secondary circuit electrically connected to a secondary side of the transformer T1. The primary circuit includes a high-voltage capacitor C1 and two bridge arms electrically connected in parallel to a high-voltage DC end (HV+ terminal and HV-terminal), wherein the two bridge arms includes a first bridge arm formed by a power switch Qp1 and a power switch Qp2 electrically connected in series and a second bridge arm formed by a power switch Qp3 and a power switch Qp4 electrically connected in series, and wherein the two terminals of the primary side of the transformer T1 is connected to a midpoint of the first bridge arm and a midpoint of the second bridge arm respectively. The secondary circuit includes a first power switch SR1, a second power switch SR2, a filter inductor L1, and a low-voltage capacitor C2, wherein the secondary side of the transformer T1 includes a first terminal, a second terminal, and a third terminal. One end of the first power switch SR1 is electrically connected to the first terminal, one end of the second power switch SR2 is electrically connected to the third terminal, both the other end of the first power switch SR1 and the other end of the second power switch SR2 are electrically connected to a negative end of the low-voltage capacitor C2 and a DC output negative end (LV−) of the secondary circuit, and the second terminal of the secondary side of the transformer T1 is electrically connected to a positive end of the low-voltage capacitor C2 and a DC output positive end (LV+) of the secondary circuit through the filter inductor L1. To reduce a voltage spike on the secondary power switches during the forward working of the DC/DC converter, the active clamping circuits (in this embodiment, for example, a clamping branch consisting of a clamping capacitor Cc1 and a switch Pmos1 electrically connected in series, and a clamping branch consisting of a clamping capacitor Cc2 and a switch Pmos2 electrically connected in series) may be electrically connected in parallel to the first power switch SR1 and the second power switch SR2, respectively.

Figure 2:
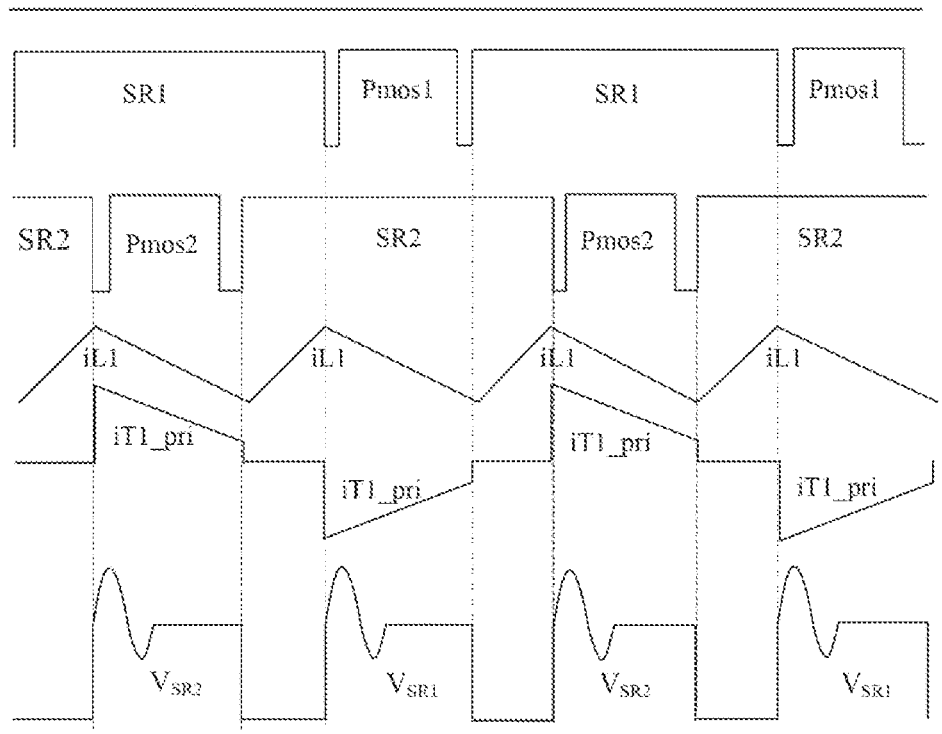
FIG. 2 is a waveform diagram of devices when the topology of FIG. 1 works reversely (with power transferred from a low-voltage side to a high-voltage side).

FIG. 2 shows waveforms when the DC/DC converter of FIG. 1 is working reversely. The high-voltage capacitor C1 includes capacitors inside the DC/DC converter and on a high-voltage bus and has a very large capacitance value. Since a voltage on the capacitor C1 shall be charged from 0V to a voltage value close to a high-voltage lithium battery voltage in a short time, there may be a large current in the low-voltage side line during a reverse startup stage. At the moment the synchronous rectifier power switches (i.e., the power switches SR1 and SR2 at the low-voltage side) are turned off, a large voltage spike occurs at both ends of the synchronous rectifier power switches (e.g., between a drain and a source of the MOSFET). The reasons are as follows: a) energy of the leakage inductance on low-voltage side (leakage inductance and PCB leakage inductance at the secondary side of the transformer) is transferred to the clamping capacitors (i.e., Cc1 and Cc2); b) leakage inductance on high-voltage side (leakage inductance and PCB leakage inductance at the primary side of the transformer) prevents rapid rising of a primary current (iT1_pri) of the transformer till the primary current equals to a current value which is converted from a low-voltage side inductive current (iL1) via a turn ratio of the transformer, and during this period, a part of the low-voltage side current iL1 flows to the clamping capacitors; c) with increasing of the voltage at the high-voltage side, a platform voltage converted to the low-voltage side is also increased, and the voltage spike of the clamping capacitors includes the platform voltage. Considering that the clamping effect is not fully ideal (due to a limited capacitance value of the clamping capacitor, a PCB leakage inductance, or a turn-on delay of the diode, etc.), the voltage spike of the synchronous rectifier power switch is often slightly greater than a voltage spike of the clamping capacitor. To ensure the voltage spike of the synchronous rectifier power switch does not exceed a limit, in the control method that known to the inventors, a low-voltage side current value (that is the current value of the low-voltage side) with a margin is set, so the reverse charging capability of the converter is limited.

To facilitate description, hereinafter a driving signal for secondary power switches (i.e., power switches at the low-voltage side) of the DC/DC converter is defined as a first driving signal, and a driving signal for primary power switches (i.e., power switches at the high-voltage side) of the DC/DC converter is defined as a second driving signal.

Figure 3:
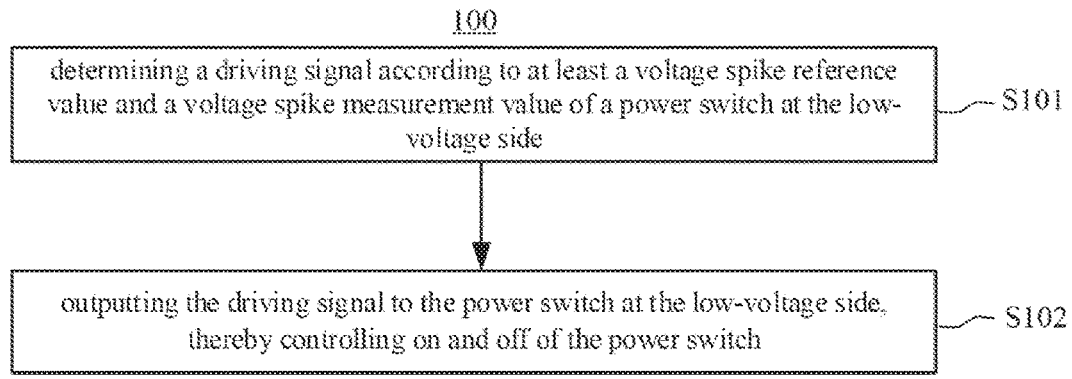
FIG. 3 is a flow diagram of a startup control method when the DC/DC converter is started reversely from a low-voltage side to a high-voltage side according to the disclosure.

The disclosure provides a startup control method 100 for a DC/DC converter, which is applied to the startup process of the DC/DC converter with energy transferred from the low-voltage side to the high-voltage side, as shown in FIG. 3. For example, the startup control method 100 may include:

S101, determining a driving signal at least according to a voltage spike reference value and a voltage spike measurement value of a power switch at the low-voltage side;

S102, outputting the driving signal to the power switch at the low-voltage side, thereby controlling on or off of the power switch.

In step S101, determining a driving signal may include determining either a duty cycle of a first driving signal or a frequency of the first driving signal.

The subsequent embodiments are explained with the example of regulating the duty cycle of the first driving signal.

Figure 4:
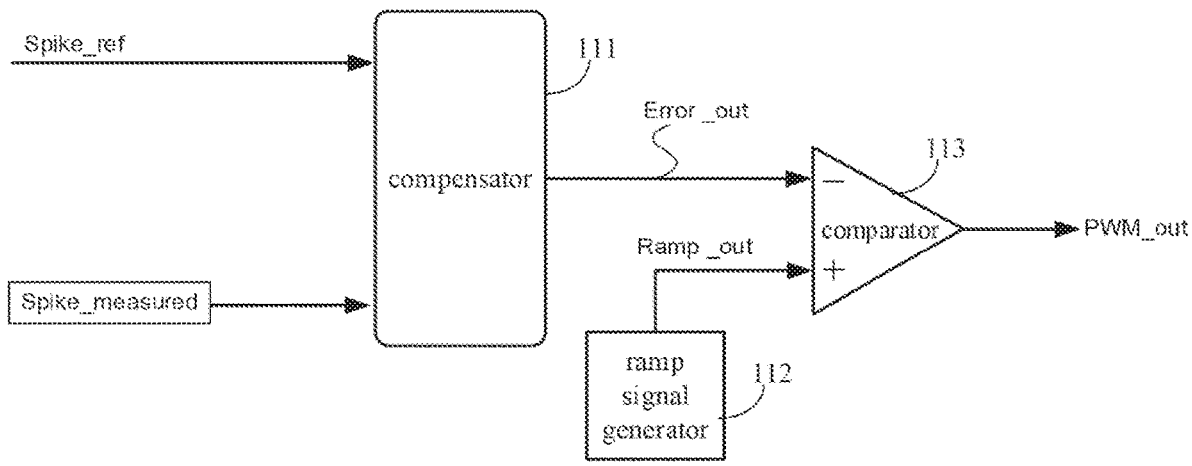
FIG. 4 is a closed-loop control block diagram when the DC/DC converter is started reversely according to the disclosure.

FIG. 4 shows a closed-loop control block diagram for a DC/DC converter during its reverse startup process according to one embodiment of the disclosure. The DC/DC converter of the disclosure utilizes a startup control system including a compensator 111 and a driving signal generator, wherein the driving signal generator may include a ramp signal generator 112 and a comparator 113, for reverse startup of the DC/DC converter from the low-voltage side to the high-voltage side. The compensator 111 is configured to receive at least a voltage spike reference value Spike_ref and a voltage spike measurement value Spike_measured of the power switch at the low-voltage side, and output a modulation signal Error_out at least according to the voltage spike reference value Spike_ref and the voltage spike measurement value Spike_measured. The ramp signal generator 112 is configured to output a ramp signal Ramp_out. The comparator 113 is configured to receive the modulation signal Error_out and the ramp signal Ramp_out, and output a first driving signal PWM_out, wherein the first driving signal PWM_out is output to the power switch at the low-voltage side, thereby controlling the on or off of the power switch at the low-voltage side and transmitting energy from the low-voltage side to the high-voltage side.

In this embodiment, the ramp signal Ramp_out may be sawtooth waves, triangular waves, or other waves, but the disclosure is not limited thereto. Besides, the compensator 111 may include inside a P regulator, a PI regulator, a PID regulator, a PIR regulator, or nonlinear regulators, and the specific types may be selected according to actual situations.

Figure 5:
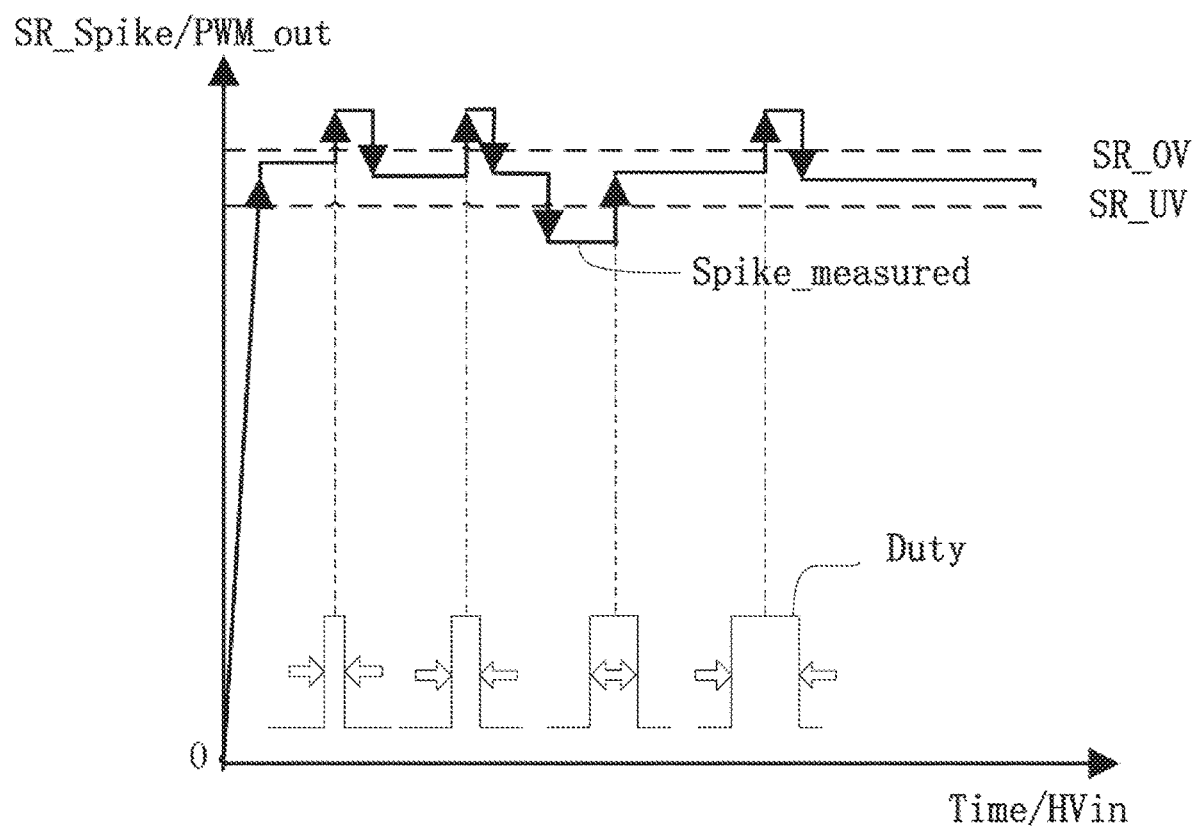
FIG. 5 shows a closed-loop control embodiment when the DC/DC converter is started reversely according to the disclosure.

FIG. 5 shows an embodiment of closed-loop control for the DC/DC converter during its reverse startup process. The voltage spike reference value Spike_ref includes a first threshold SR_OV (i.e., an overvoltage point) and a second threshold SR_UV (i.e., an under-voltage point), and the first threshold SR_OV is greater than the second threshold SR_UV. Determining a duty cycle of the first driving signal PWM_out includes: when the voltage spike measurement value Spike_measured is greater than or equal to the first threshold SR_OV, decreasing the duty cycle of the first driving signal PWM_out; when the voltage spike measurement value Spike_measured is less than or equal to the second threshold SR_UV, increasing the duty cycle of the first driving signal PWM_out; when the voltage spike measurement value Spike_measured is between the first threshold SR_OV and the second threshold SR_UV, holding the duty cycle of the first driving signal PWM_out unchanged, or decreasing or increasing the duty cycle of the first driving signal PWM_out, but the disclosure is not limited thereto. Therefore, the compensator 111 in the startup control system of FIG. 4 of the disclosure is configured to: regulate the output modulation signal Error_out to increase or decrease the duty cycle of the first driving signal PWM_out according to the relation between the voltage spike measurement value Spike_measured and the voltage spike reference value (including the overvoltage point and the under-voltage point). When the voltage spike measurement value Spike_measured is greater than or equal to the first threshold SR_OV, the compensator 111 regulates the modulation signal Error_out to decrease the duty cycle of the first driving signal PWM_out, and when the voltage spike measurement value Spike_measured is less than or equal to the second threshold SR_UV, the compensator 111 regulates the modulation signal Error_out to increase the duty cycle of the first driving signal PWM_out.

Figure 6:
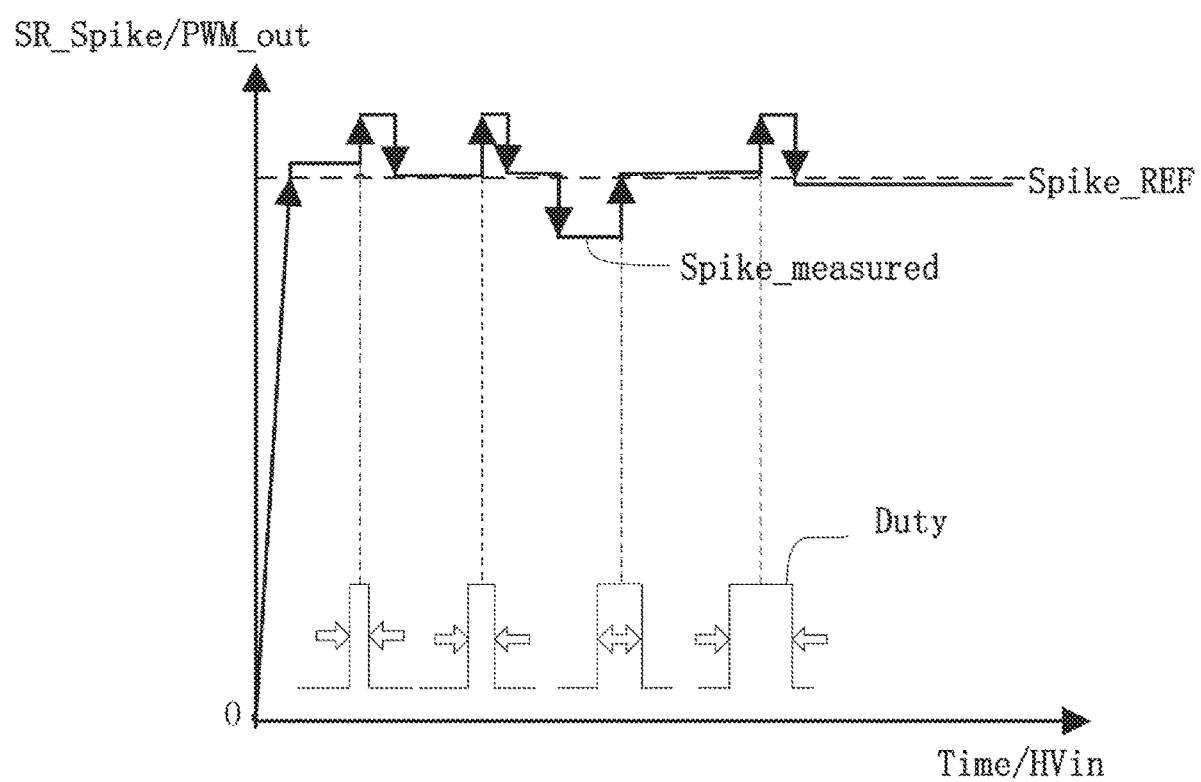
FIG. 6 shows another closed-loop control embodiment when the DC/DC converter is started reversely according to the disclosure.

FIG. 6 shows another embodiment of closed-loop control for the DC/DC converter during its reverse startup process, wherein there is only one reference value. Determining the first driving signal PWM_out includes: obtaining a voltage error according to the voltage spike measurement value Spike_measured and the voltage spike reference value Spike_ref, obtaining the modulation signal Error_out by inputting the voltage error to a regulator, where the regulator may be a P regulator, a PI regulator, a PID regulator, a PIR regulator or nonlinear regulators, and then obtaining the first driving signal PWM_out according to the modulation signal Error_out. The regulation process is as follows: when the voltage spike measurement value Spike_measured is greater than the voltage spike reference value Spike_ref, decreasing the duty cycle of the first driving signal PWM_out; and when the voltage spike measurement value Spike_measured is less than the voltage spike reference value Spike_ref, increasing the duty cycle of the first driving signal PWM_out. Therefore, the compensator 111 in FIG. 4 may be configured to: regulate the modulation signal Error_out on basis of the voltage error between the voltage spike reference value Spike_ref and the voltage spike measurement value Spike_measured, thereby regulating the duty cycle of the first driving signal PWM_out; when the voltage spike measurement value Spike_measured is greater than the voltage spike reference value Spike_ref, decrease the duty cycle of the first driving signal PWM_out by regulating the modulation signal Error_out; and when the voltage spike measurement value Spike_measured is less than the voltage spike reference value Spike_ref, increase the duty cycle of the first driving signal PWM_out by regulating the modulation signal Error_out.

It shall be noted that in the embodiments of FIGS. 5 and 6, the voltage spike reference value may be either a constant value or a variable value, such as a value increasing linearly with a specific slope or a stepped-changing value.

Figure 7:
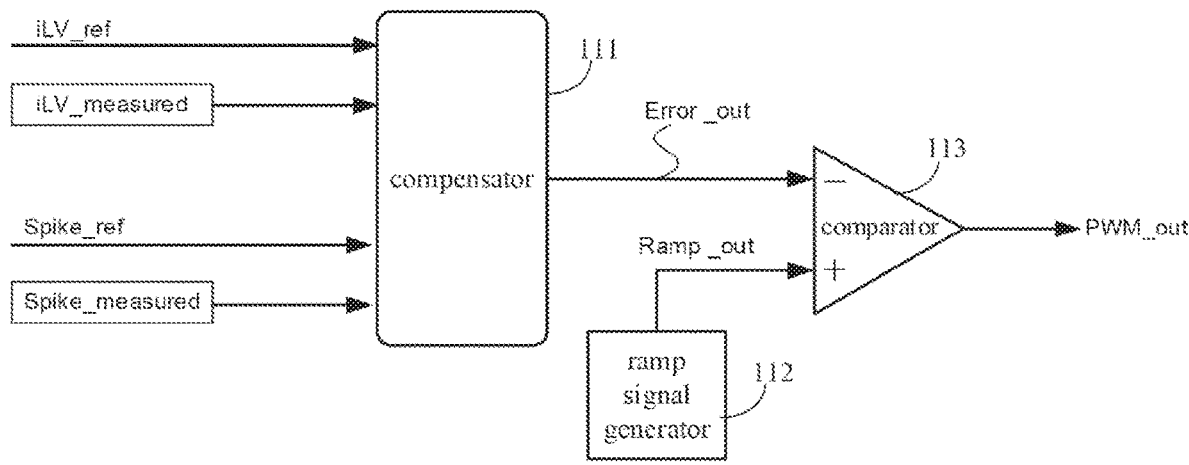
FIG. 7 is another closed-loop control block diagram when the DC/DC converter is started reversely according to the disclosure.

In the embodiments shown in FIGS. 4-6, only the voltage spike signals on the power switches shall be detected without considering the low-voltage side current. To further improve the control effect of the system, and avoid the overcurrent phenomenon in the startup process, in another embodiment of the disclosure, the startup control method 100 may further include determining the duty cycle or the frequency of the first driving signal based on a low-voltage side current reference value and a low-voltage side current measurement value at the low-voltage side. FIG. 7 shows a closed-loop control block diagram according to another embodiment of the disclosure when the DC/DC converter is started reversely. In this embodiment, the compensator 111 is further configured to receive the low-voltage side current reference value iLV_ref and the low-voltage side current measurement value iLV_measured, and output the modulation signal Error_out according to the voltage spike reference value Spike_ref, the voltage spike measurement value Spike_measured, the low-voltage side current reference value iLV_ref, and the low-voltage side current measurement value iLV_measured.

As compared to the embodiment shown in FIG. 4, this embodiment adds the low-voltage side current reference value iLV_ref and the low-voltage side current measurement value iLV_measured as inputs to the compensator 111. Therefore, the actual application of the disclosure can be divided into two types: 1. the compensator 111 receives only two variables including the voltage spike reference value Spike_ref and the voltage spike measurement value Spike_measured, and determines the duty cycle or the frequency of the first driving signal PWM_out of the power switch at the low-voltage side according to the two variables. 2. the compensator 111 receives four variables including the voltage spike reference value Spike_ref, the voltage spike measurement value Spike_measured, the low-voltage side current reference value iLV_ref and the low-voltage side current measurement value iLV_measured, and determines the duty cycle or the frequency of the first driving signal PWM_out of the power switch at the low-voltage side according to all the four variables.

Figure 8:
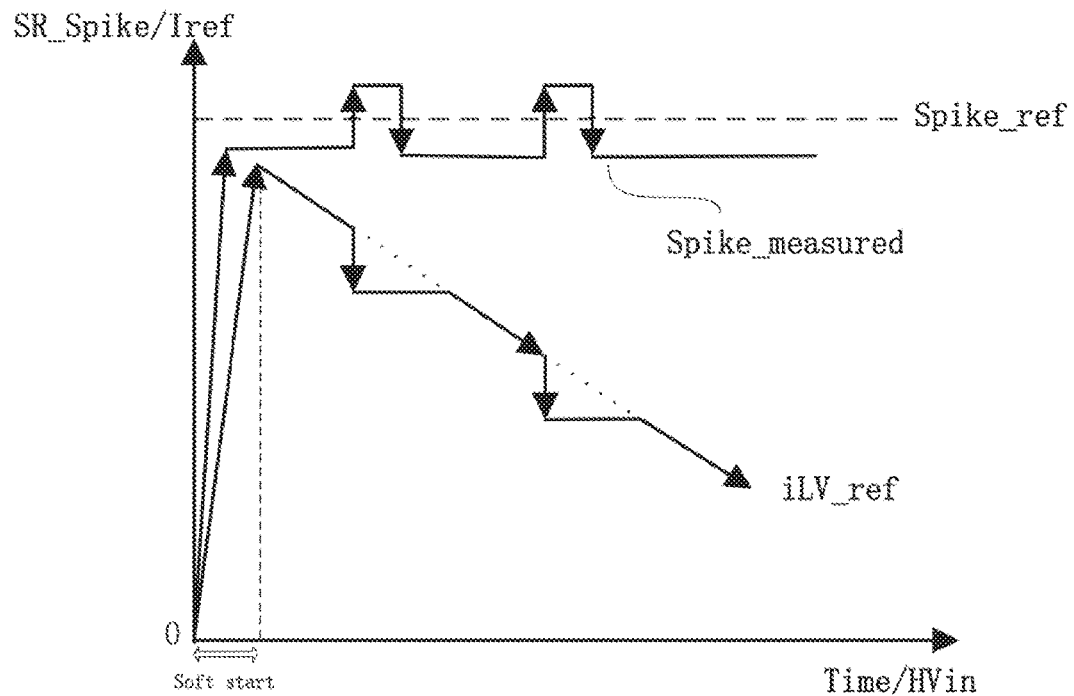
FIG. 8 shows still another closed-loop control embodiment when the DC/DC converter is started reversely according to the disclosure.
Figure 9:
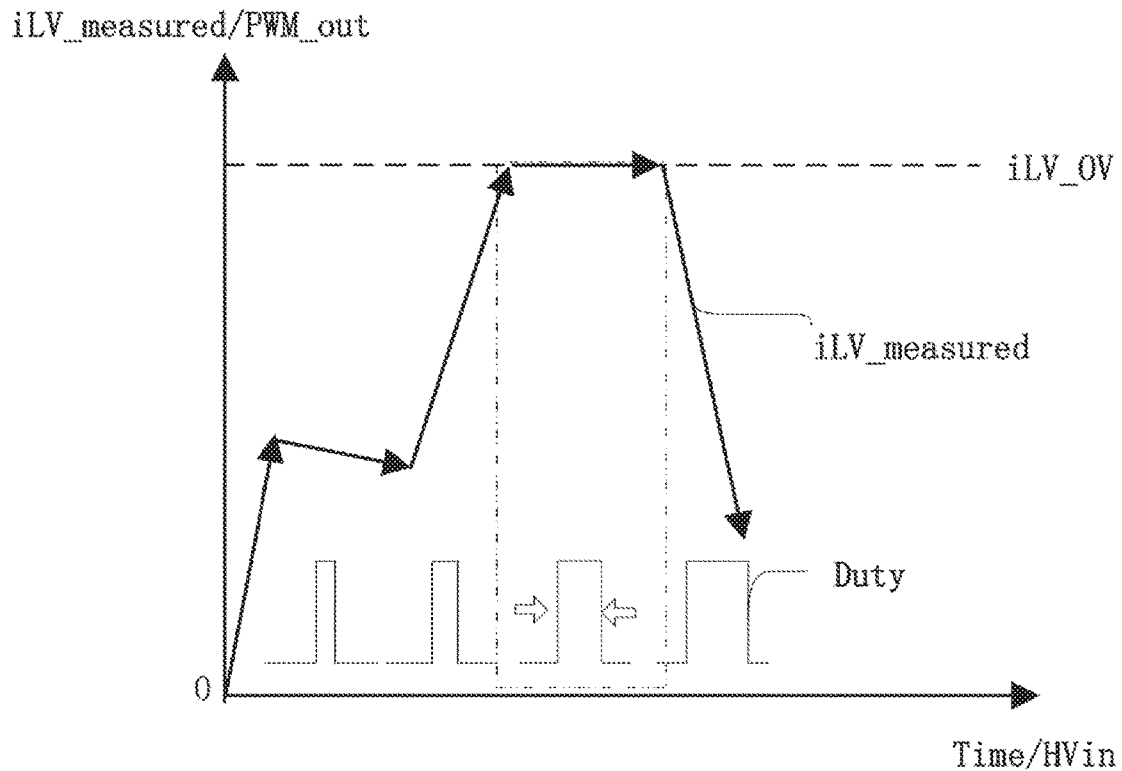
FIG. 9 shows a current-limiting embodiment when the DC/DC converter is started reversely according to the disclosure.

FIG. 8 shows another embodiment of closed-loop control for the DC/DC converter during its reverse startup process. In this embodiment, determining the duty cycle of the first driving signal includes: when the voltage spike measurement value Spike_measured is greater than or equal to the voltage spike reference value Spike_ref, reducing the low-voltage side current reference value iLV_ref, thereby decreasing the duty cycle of the first driving signal PWM_out. Specifically, in this embodiment, a current error is firstly obtained by comparing the low-voltage side current measurement value iLV_measured with the low-voltage side current reference value iLV_ref, and then, the current error is inputted to a regulator (such as a P regulator, a PI regulator, or a PIR regulator) to obtain the first driving signal. In this embodiment, the low-voltage side current reference value iLV_ref can be modified according to the voltage spike measurement value and the voltage spike reference value. As the soft-start process tends to its end, the low-voltage side current reference value iLV_ref is linearly reduced as the high-voltage side voltage (the voltage of high-voltage side) rises. If the voltage spike measurement value Spike_measured of the power switch at the low-voltage side exceeds the voltage spike reference value Spike_ref, the low-voltage side current reference value iLV_ref is reduced immediately, resulting in that modulation signal Error_out calculated by the compensator 111 changes and the duty cycle of the first driving signal PWM_out decreases eventually. Since the low-voltage side current reduces with the reference value, the voltage spike measurement value Spike_measured of the power switch quickly returns below the voltage spike reference value Spike_ref also. Therefore, the compensator 111 in the startup control system of FIG. 7 of the disclosure may be configured to: when the voltage spike measurement value Spike_measured is greater than or equal to the voltage spike reference value Spike_ref, regulate the modulation signal Error_out to decrease the duty cycle of the first driving signal by reducing the low-voltage side current reference value iLV_ref. In another embodiment of the disclosure, to ensure that the low-voltage side current is operated within a safe range during the reverse startup process, current-limiting measures are added in the reverse startup process to reduce stress on power supply devices at the low-voltage side. FIG. 9 shows a current-limiting embodiment according to the disclosure when the DC/DC converter is started reversely. A low-voltage side overcurrent point iLV_OV (i.e., the low-voltage side current reference value) is set in advance, and the duty cycle of the first driving signal is determined, wherein when the low-voltage side current measurement value iLV_measured is greater than or equal to the low-voltage side overcurrent point iLV_OV, the duty cycle of the first driving signal is controlled to decrease. The working principle of this embodiment is that when the low-voltage side current measurement value iLV_measured is greater than or equal to the preset low-voltage side current reference value (i.e., iLV_OV in FIG. 9), the duty cycle of the first driving signal is decreased, and when the low-voltage side current measurement value iLV_measured is less than the preset low-voltage side current reference value (i.e., iLV_OV in FIG. 9), the duty cycle is decided by the voltage spike measurement value and the voltage spike reference value in FIG. 5 or 6. Therefore, the compensator 111 in the startup control system of FIG. 7 of the disclosure is further configured to: when the low-voltage side current measurement value is greater than or equal to the low-voltage side current reference value, regulate the modulation signal Error_out to decrease the duty cycle of the first driving signal PWM_out.

In another embodiment of the disclosure, when the DC/DC converter is a resonant converter, the frequency of the first driving signal may be determined according to at least the voltage spike measurement value and the voltage spike reference value of the power switch at the low-voltage side. In the resonant DC/DC converter, different switching frequencies correspond to different gains (i.e., a ratio of the output voltage to the input voltage), so during reverse startup process, the switching frequencies decide currents flowing through the power switches at the low-voltage side, thereby affecting the voltage spike when the power switches are turned off. Given this, in some embodiments of the disclosure, the frequency of the first driving signal can also be controlled by comparing the voltage spike measurement value with the preset voltage spike reference value of the power switch at the low-voltage side. Specifically, when the voltage spike measurement value is greater than or equal to the first threshold, the frequency of the first driving signal is increased, and when the voltage spike measurement value is less than or equal to the second threshold, the frequency of the first driving signal is decreased. Further, the low-voltage side current may also be limited by taking the low-voltage side current measurement value and the low-voltage side current reference value into consideration, such that the voltage spike of the power switch and the current of the converter are ensured not to exceed a limit during reverse startup process.

Figure 10:
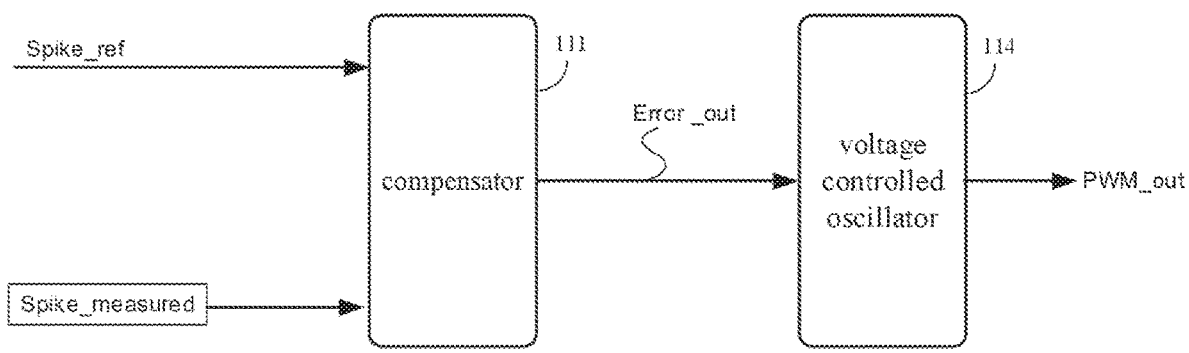
FIG. 10 is still another closed-loop control block diagram when the DC/DC converter is started reversely according to the disclosure.

FIG. 10 shows still another closed-loop control block diagram when the DC/DC converter is started reversely according to the disclosure. In this embodiment, the DC/DC converter of the disclosure can achieve reverse startup from the low-voltage side to the high-voltage side using a startup control system including the compensator 111 and the driving signal generator (including a voltage controlled oscillator 114). The compensator 111 is configured to receive the voltage spike reference value Spike_ref and the voltage spike measurement value Spike_measured, or receive the voltage spike reference value Spike_ref, the voltage spike measurement value Spike_measured, the low-voltage side current reference value iLV_ref, and the low-voltage side current measurement value iLV_measured, and output the modulation signal Error_out based on them. The voltage controlled oscillator 114 is configured to receive the modulation signal Error_out, and output the first driving signal PWM_out. For example, the frequency of the first driving signal PWM_out is determined on basis of the modulation signal Error_out and is sent to the power switch at the low-voltage side, thereby controlling the on or off of the power switch at the low-voltage side, so that the energy can be transmitted from the low-voltage side to the high-voltage side.

The startup control system of the disclosure may further include a voltage spike measurement unit for acquiring the voltage spike measurement value of the power switch at the low-voltage side.

During an initial stage of forward startup of the DC/DC converter shown in FIG. 1, the active clamping capacitors Cc1 and Cc2 shall be pre-charged to a voltage value converted from an input voltage at the high-voltage side via a turn ratio of the transformer. However, due to the influence of factors such as device tolerance and environment temperature, such as, delay characteristics of the driver, turn-on and turn-off characteristics of the MOSFET, and capacitance differences of the clamping capacitors, if a difference between a voltage of the clamping capacitors after pre-charging and an expected value is too large, during the soft startup process, the power switches (Pmos1 and Pmos2 shown in FIG. 1) within the active clamping circuit may undergo a large current surge, which may result that the spike of the rectifier power switches exceeds a limit.

Figure 11:
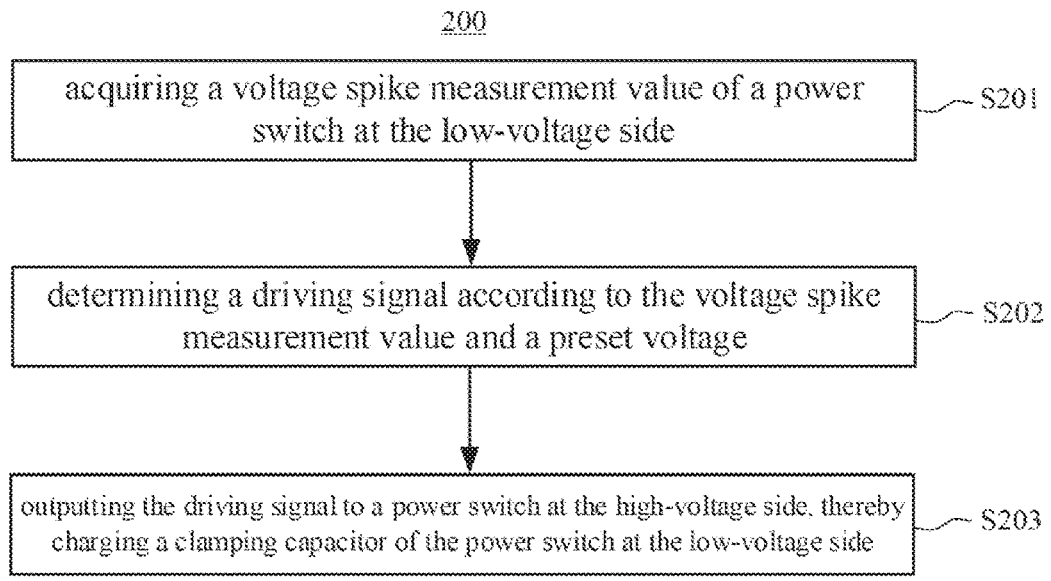
FIG. 11 is a flow diagram of a startup control method when the DC/DC converter starts forwardly (with power transferred from a high-voltage side to a low-voltage side) according to the disclosure.

As shown in FIG. 11, the disclosure further provides a startup control method 200 for a DC/DC converter for startup of the DC/DC converter from a high-voltage side to a low-voltage side. The startup control method 200 may include:

S201, acquiring a voltage spike measurement value of a power switch at the low-voltage side;

S202, determining a driving signal according to the voltage spike measurement value and a preset voltage; and S203, outputting the driving signal to a power switch at the high-voltage side, thereby charging a clamping capacitor of the power switch at the low-voltage side.

It shall be noted that in the step S202, determining a driving signal may be determining either a duty cycle or a frequency of a second driving signal.

Taking the example of regulating the duty cycle of the second driving signal, during the stage of pre-charging the clamping capacitors, the duty cycle of the second driving signal is gradually increased from zero. When a difference between the voltage spike measurement values obtained in two adjacent samplings reaches (i.e., is greater than or equal to) a first preset voltage, the duty cycle of the second driving signal is controlled to be unchanged till the voltage spike measurement value reaches (i.e., is greater than or equal to) a second preset voltage. Then stop outputting the second driving signal.

Figure 12:
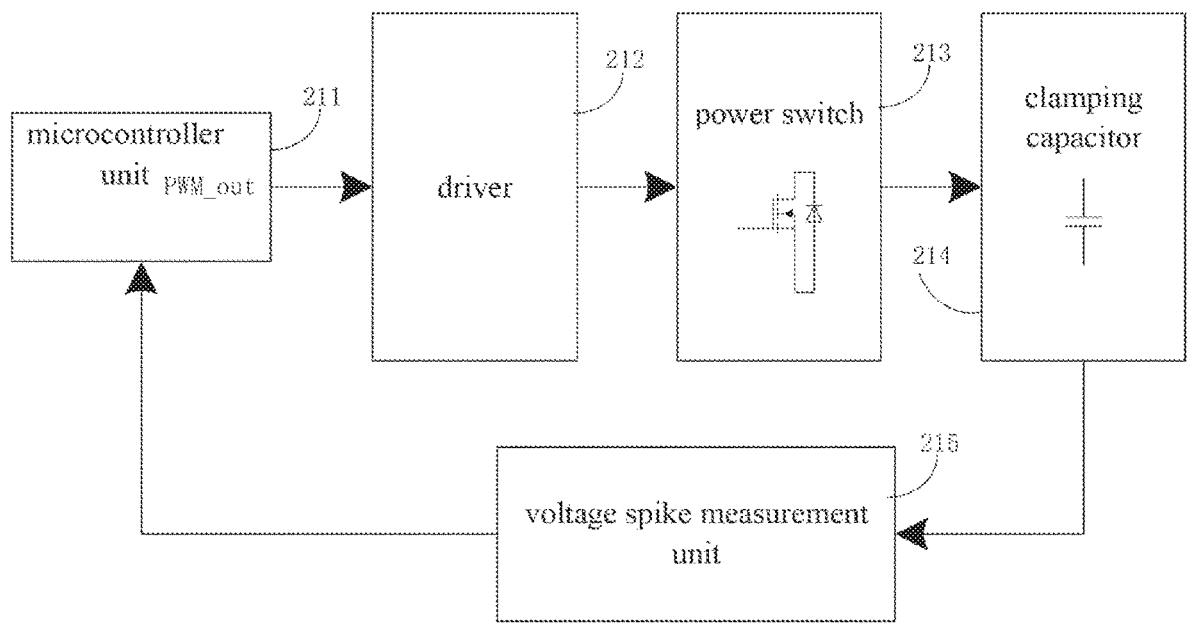
FIG. 12 is a control block diagram where the DC/DC converter pre-charges a clamping capacitor when started forwardly according to the disclosure.

FIG. 12 shows a control block diagram where a clamping capacitor is pre-charged before the DC/DC converter being started forwardly according to the disclosure. It is unnecessary for the DC/DC converter to add an additional pre-charge circuit, thereby pre-charging the clamping capacitor of the power switch at the low-voltage side, and controlling a pre-charge voltage accurately. The startup control system of the disclosure includes a microcontroller unit (MCU) 211 for receiving the voltage spike measurement value of the power switch at the low-voltage side, and outputting a second driving signal based on the voltage spike measurement value and a preset voltage, wherein the second driving signal is configured to control the on or off of the power switch at the high-voltage side (e.g., Qp1 to Qp4 shown in FIG. 1), thereby charging clamping capacitors (e.g., capacitors Cc1 and Cc2 shown in FIG. 1) of the power switch at the low-voltage side.

In one embodiment of the disclosure, the second driving signal may be transmitted to the power switch 213 at the high-voltage side via a driver 212, thereby charging the clamping capacitor 214 of the power switch at the low-voltage side. Preferably, the startup control system may further include a voltage spike measurement unit 215 for acquiring the voltage spike measurement value of the power switch at the low-voltage side that indirectly equivalent to a voltage of the clamping capacitors for feedback control.

Figure 13:
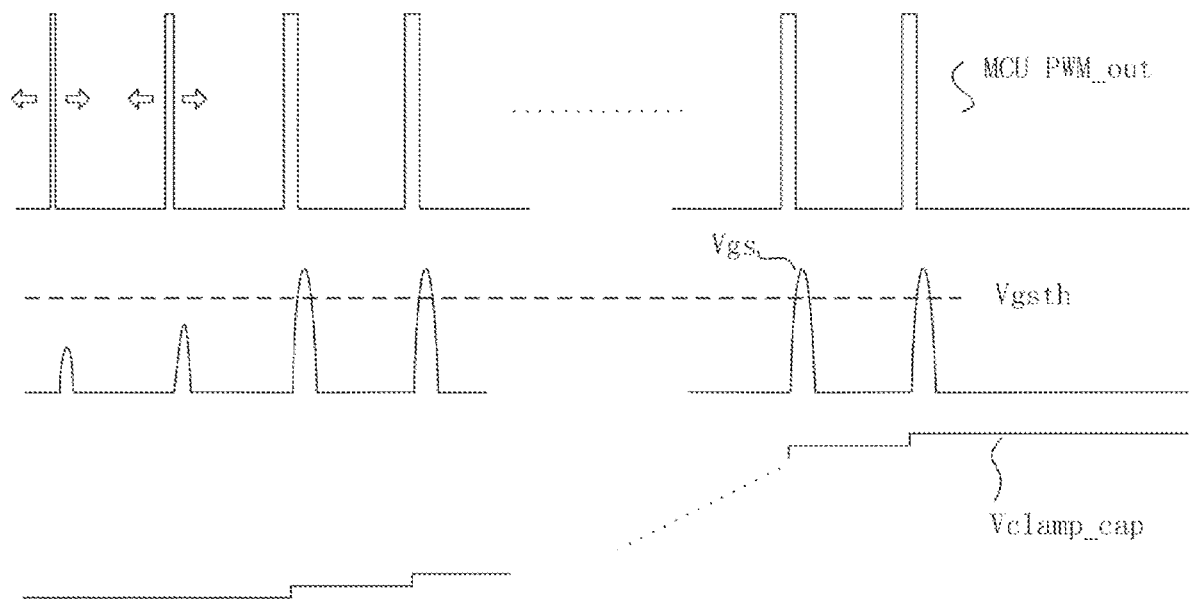
FIG. 13 is a waveform diagram of one embodiment where the DC/DC converter pre-charges the clamping capacitor when started forwardly according to the disclosure.

FIG. 13 shows a waveform diagram of one embodiment where the clamping capacitor is pre-charged before the DC/DC converter being started forwardly according to the disclosure. FIG. 13 shows the waveform of the second driving signal, the waveform of the actual driving signal output to the power switches at the high-voltage side after the second driving signal passes through the driving chips, and the waveform of the voltage of the clamping capacitor of the power switches at the low-voltage side sequentially from top to bottom. The duty cycle of a pulse signal MCU PWM_out (i.e., the second driving signal) emitted from the microcontroller unit at the beginning of pre-charging may be zero, while a voltage spike of the power switch at the low-voltage side is detected. Due to the narrow width of the pulse signal, the power switch at the high-voltage side is always in an off state, so no energy is delivered to the clamping capacitor of the power switch at the low-voltage side. Subsequently, the duty cycle of the pulse signal MCU PWM_out is gradually increased, such that the power switch at the high-voltage side enters from an off region into a linear region, and the voltage of the clamping capacitor is slightly increased. Once a difference of the voltage spike measurement values obtained in two adjacent samplings reaches a first preset voltage, the MCU holds the duty cycle of the pulse signal MCU PWM_out unchanged and charges the clamping capacitor continuously till the voltage spike measurement value reaches a second preset voltage. Then the second driving signal may be closed. Such a control method is free from the influence of factors such as parameter difference of the device and temperature change on pre-charge effect, such that consistency of pre-charge results can be ensured.

It can be understood that the closed-loop pre-charge control method for the active clamping capacitor in the embodiments of the disclosure is not limited to the duty cycle control aforesaid, and may also be frequency control. For example, in the case of a fixed duty cycle, the MCU may timely adjust the frequency of the second driving signal according to the detected voltage spike of the power switch at the low-voltage side. In detail, when the voltage spike measurement value is recognized to begin increasing with a preset extent (i.e., the first preset voltage), the frequency of the second driving signal is fixed. Once the voltage spike measurement value reaches a second preset voltage, stop sending the second driving signal. It shall be noticed that the startup control method of the disclosure is not only applicable to the circuit structure shown in FIG. 1. In some other embodiments, a primary circuit of the DC/DC converter may be a half-bridge structure, and a secondary circuit may be a full-bridge structure. In still some other embodiments, the DC/DC converter may be in a resonant topological structure such as LLC or CLLC, but the disclosure is not limited thereto.

Hereinafter a voltage spike measurement circuit for a power switch in the disclosure is explained in detail with reference to FIGS. 14 to 20.

Figure 14:
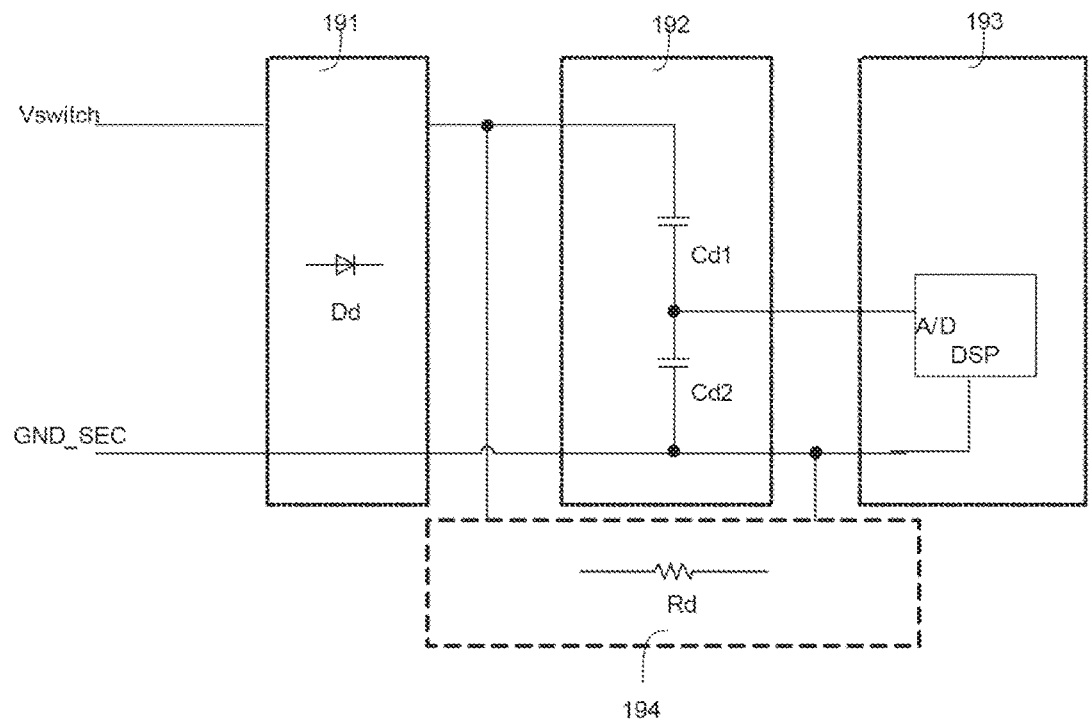
FIG. 14 is a block diagram of a voltage spike measurement circuit for a power switch according to the disclosure.

As shown in FIG. 14, a voltage spike measurement circuit for the power switch in the disclosure mainly includes a rectifier unit 191, a capacitive divider unit 192, and a discharge unit 194. The rectifier unit 191 receives a voltage signal Vswitch at both ends of a power switch and outputs a rectified signal. The capacitive divider unit 192 includes at least two capacitors connected in series, and the capacitive divider unit 192 receives the rectified signal, divides the rectified signal based on a capacitance ratio of the capacitors, and outputs a divider signal to a digital signal processor (DSP) 193, for example, to calculate a voltage spike measurement value of the power switch. The discharge unit 194 is connected in parallel to the capacitive divider unit 192. For example, the voltage signal may be a voltage signal of the power switch SR1 and/or a voltage signal of the power switch SR2 in FIG. 1.

In the disclosure, the rectifier unit 191 may include, for example, a rectifier diode Dd, and the voltage signal Vswitch at both ends of the power switch is input from an anode of the rectifier diode Dd. The rectifier unit 191 can extract and transmit a voltage spike of the power switch to the capacitive divider unit 192.

In the disclosure, the capacitive divider unit 192 may include, for example, a first capacitor Cd1 and a second capacitor Cd2 connected in series, and the divider signal is output from both ends of the second capacitor Cd2. The capacitive divider unit 192 can hold the voltage spike of the power switch using the capacitors and divides the voltage spike according to the capacitance ratio to obtain the divider signal receivable by a controller. The number of capacitors may be selected according to actual situations.

Figure 15:
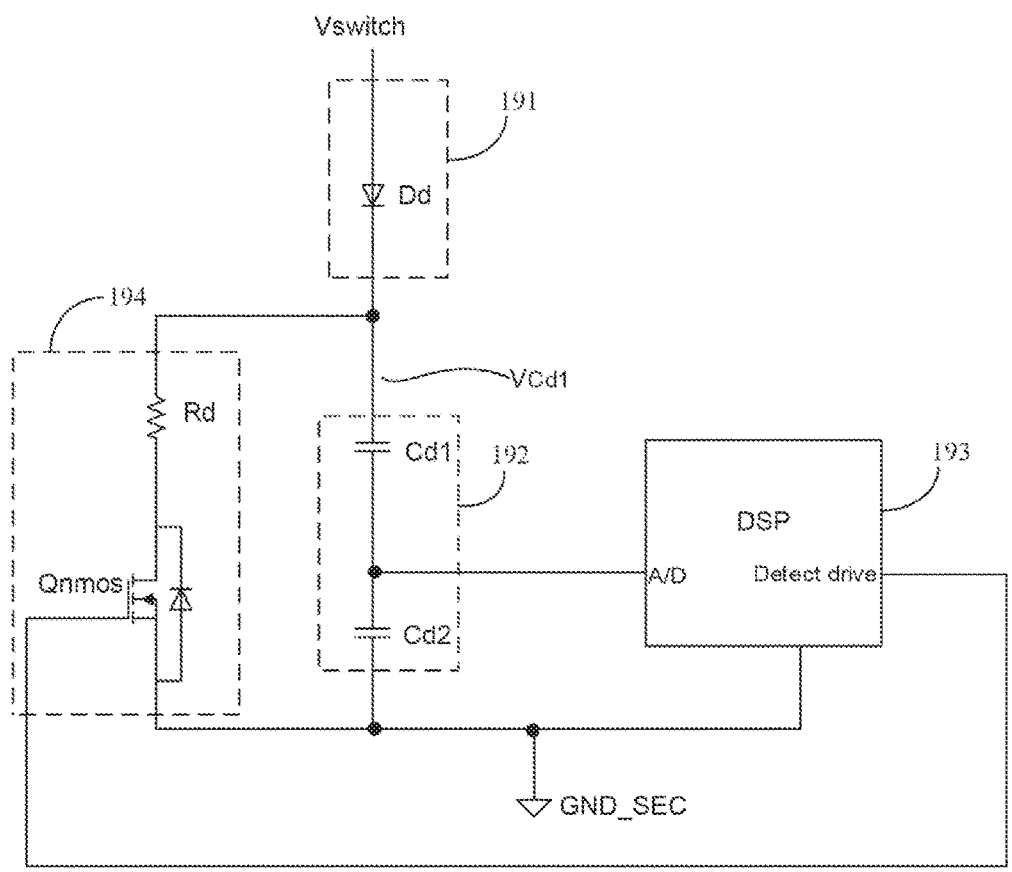
FIG. 15 shows an embodiment of the voltage spike measurement circuit for a power switch according to the disclosure.
Figure 17:
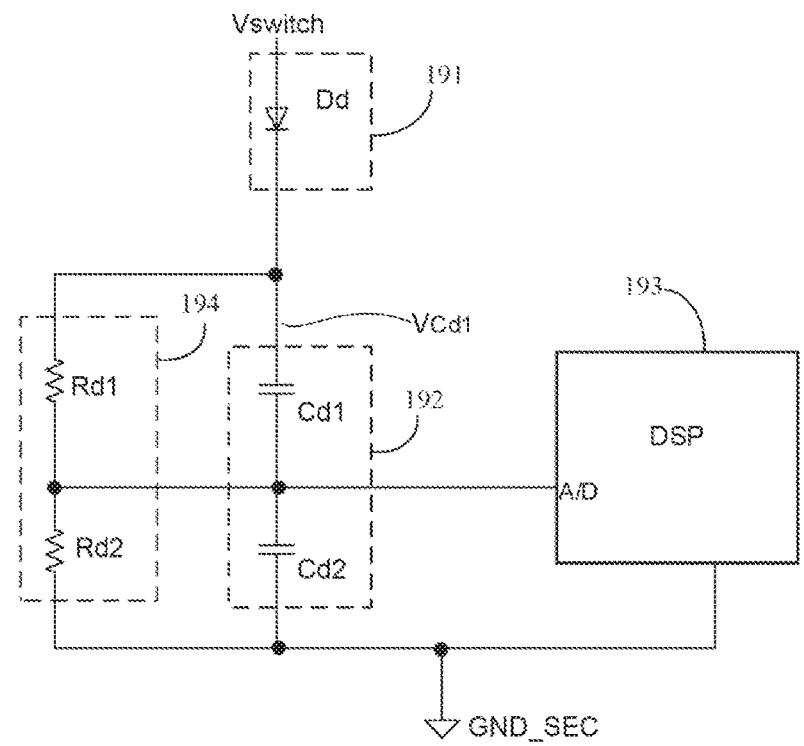
FIG. 17 shows another embodiment of the voltage spike measurement circuit for a power switch according to the disclosure.
Figure 19:
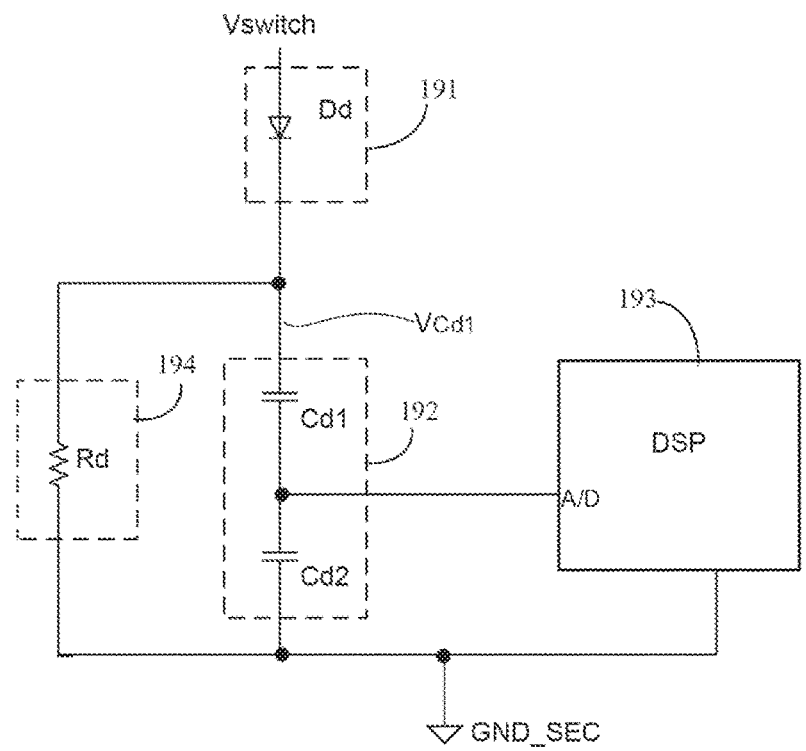
FIG. 19 shows still another embodiment of the voltage spike measurement circuit for a power switch according to the disclosure.

In the disclosure, the discharge unit 194 may be the structures as shown in FIGS. 15, 17, and 19, but the disclosure is not limited thereto.

FIG. 15 shows a preferable embodiment of the voltage spike measurement circuit for the power switch according to the disclosure. The discharge unit 194 includes a first switch Qnmos connected in series to a discharge resistor Rd, and a control end of the first switch Qnmos is further connected to the digital signal processor DSP. The first capacitor Cd1 and the second capacitor Cd2 are preferably COG ceramic capacitors, with a preferable initial tolerance of 1% or 5%.

Figure 16:
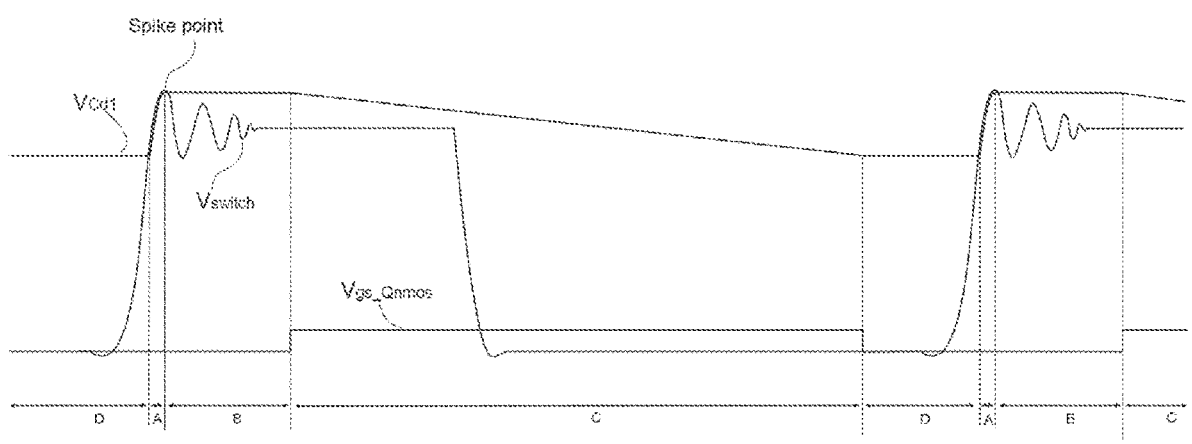
FIG. 16 shows the working waveforms in the embodiment of FIG. 15.

FIG. 16 shows working waveforms in the embodiment of FIG. 15.

1. During stage A, when the voltage Vswitch of the power switch exceeds a sum of voltages of the first capacitor Cd1 and the second capacitor Cd2 connected in series, the first capacitor Cd1 and the second capacitor Cd2 are charged through the diode Dd. When the voltage Vswitch begins to fall after rising to a voltage spike value Spike point, the diode Dd is reverse cut-off.

2. During stage B, the voltages of the first capacitor Cd1, and the second capacitor Cd2 are held unchanged. The DSP detects the voltage value of the second capacitor Cd2, such that the sum of voltages of the first capacitor Cd1 and the second capacitor Cd2 is calculated through a relation of the capacitance ratio of the first capacitor Cd1 and the second capacitor Cd2, and the value is quite proximate to the voltage spike value Spike point. If the influence of the PCB leakage inductance is ignored, a difference between the sum of voltages of the first capacitor Cd1 and the second capacitor Cd2 and the voltage spike value Spike point is only a forward turn-on voltage drop of the diode Dd.

3. During stage C, the DSP controls the first switch Qnmos to turn on and discharges the first capacitor Cd1 and the second capacitor Cd2 through the discharge resistor Rd, so the voltages of the first capacitor Cd1 and the second capacitor Cd2 are gradually reduced. At ending of stage C, the sum of voltages of the first capacitor Cd1 and the second capacitor Cd2 is equal to a platform voltage at the low-voltage side obtained by converting a high-voltage side voltage Vin through a turn ratio of the transformer T1.

4. During stage D, the DSP controls the first switch Qnmos to turn off, and the discharge circuit is cut off, so the voltages of the first capacitor Cd1 and the second capacitor Cd2 are held unchanged.

During stage D, the voltages of the first capacitor Cd1 and the second capacitor Cd2 are held unchanged because of the cut-off of the discharge circuit. On one hand, the voltages of the first capacitor Cd1 and the second capacitor Cd2 can rise from a relatively high platform voltage to the voltage spike Spike point when the power switch is turned off next time, i.e., during the next voltage spike measurement process, thereby shortening the measurement time. On the other hand, a proportional coefficient of the first capacitor Cd1 and the second capacitor Cd2 may be corrected. At this stage, the DSP calculates the sum of voltages of the first capacitor Cd1 and the second capacitor Cd2 by detecting the voltage value of the second capacitor Cd2 and then calculates a platform voltage measurement value at the low-voltage side. Meanwhile, if the switching power supply has an accurate high voltage-side voltage measurement circuit inside, a platform voltage actual value at the low-voltage side can be calculated, and then the proportional coefficient of the first capacitor Cd1 and the second capacitor Cd2 is corrected on basis of the platform voltage measurement value and the platform voltage actual value at the low-voltage side.

FIG. 17 shows another preferable embodiment of the voltage spike measurement circuit for the power switch according to the disclosure. The discharge unit 194 includes two discharge resistors Rd1 and Rd2 connected in series, and a connection node of the two discharge resistors Rd1 and Rd2 is further connected to a connection node of the first capacitor Cd1 and the second capacitor Cd2. The first capacitor Cd1 and the second capacitor Cd2 are preferably COG ceramic capacitors, with a preferable initial tolerance of 1% or 5%, and a preferable tolerance of the two discharge resistors is 1%. In one embodiment, a measurement error due to the tolerance of the first capacitor Cd1 and the second capacitor Cd2 can be balanced by selecting discharge resistors with high accuracy, thereby improving measurement accuracy.

Figure 18:
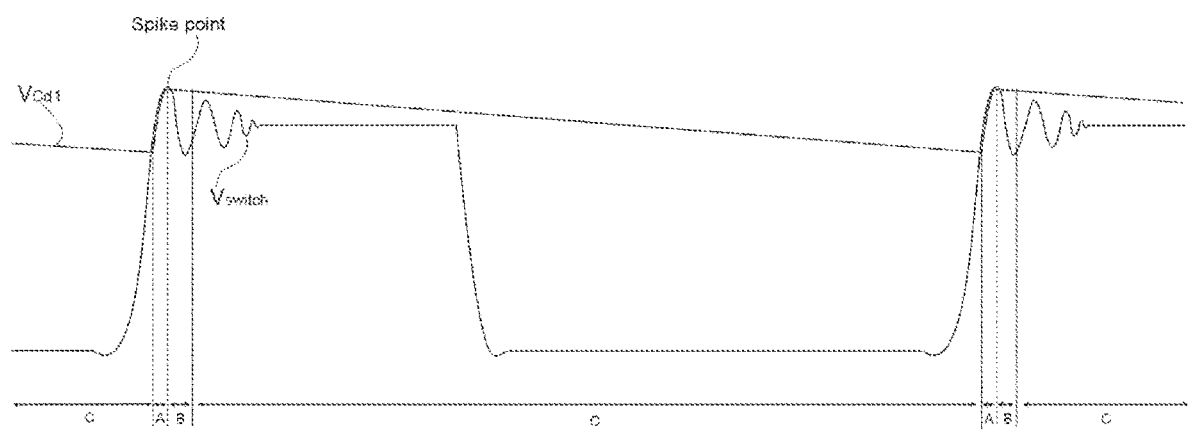
FIG. 18 shows the working waveforms in the embodiment of FIG. 17.

FIG. 18 shows working waveforms in the embodiment of FIG. 17.

1. During stage A, when the voltage Vswitch of the power switch exceeds a sum of voltages of the first capacitor Cd1 and the second capacitor Cd2 connected in series, the first capacitor Cd1 and the second capacitor Cd2 are charged through the diode Dd. When the voltage Vswitch begins to fall after rising to a voltage spike value Spike point, the diode Dd is reverse cut-off.

2. During stage B, the first capacitor Cd1, and the second capacitor Cd2 are discharged by discharge resistors Rd1 and Rd2. The DSP can detect a voltage value of the second capacitor Cd2 at an initial time of stage B, and then calculates the sum of voltages of the first capacitor Cd1 and the second capacitor Cd2 through a relation of the capacitance ratio of the first capacitor Cd1 and the second capacitor Cd2, and the value is proximate to the voltage spike value Spike point of the power switch. If influences of the PCB leakage inductance and discharging of the discharge resistors Rd1 and Rd2 are ignored, a difference between the sum of voltages of the first capacitor Cd1 and the second capacitor Cd2 and the voltage spike value Spike point of the power switch is only a forward turn-on voltage drop of the diode Dd.

3. During stage C, the first capacitor Cd1, and the second capacitor Cd2 are continuously discharged by the discharge resistors Rd1 and Rd2.

As compared to the embodiment of FIG. 15, the embodiment of FIG. 17 cannot correct the proportional coefficient of the first capacitor Cd1 and the second capacitor Cd2. Therefore, an initial deviation and temperature drift characteristics of the first capacitor Cd1 and the second capacitor Cd2 and discharge effect of the discharge resistors Rd1 and Rd2 may influence the accuracy of measurement results of the voltage spike in the embodiment of FIG. 17. In practical application, the discharge resistors Rd1 and Rd2 may be selected to be with a small tolerance, such as accuracy of +/−0.1%, and an initial deviation of the first capacitor Cd1 and the second capacitor Cd2 can be compensated by reducing resistances of the discharge resistors Rd1 and Rd2 appropriately, thereby obtaining accurate voltage spike measurement values.

FIG. 19 shows another preferable embodiment of the voltage spike measurement circuit for a power switch according to the disclosure. The discharge unit 194 includes a discharge resistor Rd. The first capacitor Cd1 and the second capacitor Cd2 are preferably COG ceramic capacitors, with a preferable initial tolerance of 1% or 5%.

Figure 20:
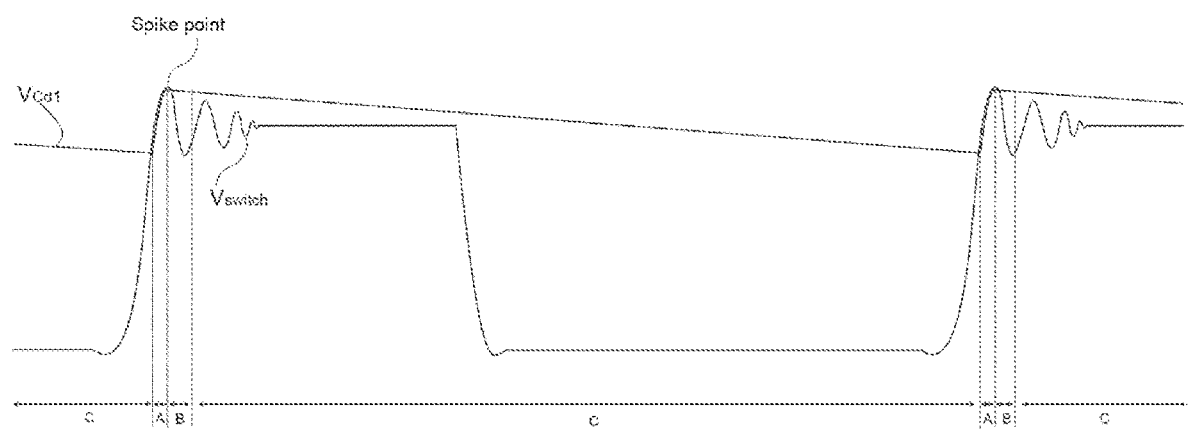
FIG. 20 shows the working waveforms in the embodiment of FIG. 19.

FIG. 20 shows working waveforms in the embodiment of FIG. 19.

1. During stage A, when the voltage Vswitch of the power switch exceeds a sum of voltages of the first capacitor Cd1 and the second capacitor Cd2 connected in series, the first capacitor Cd1 and the second capacitor Cd2 are charged through the diode Dd. When the voltage Vswitch begins to fall after reaching the voltage spike value Spike point, the diode Dd is reverse cut-off.

2. During stage B, the first capacitor Cd1, and the second capacitor Cd2 are discharged by the discharge resistor Rd. The DSP can detect a voltage value of the second capacitor Cd2 at an initial time of stage B, and then calculates the sum of voltages of the first capacitor Cd1 and the second capacitor Cd2 through the relation of the capacitance ratio of the first capacitor Cd1 and the second capacitor Cd2, and the value is proximate to the voltage spike value Spike point of the power switch. If influences of the PCB leakage inductance and discharging of the discharge resistor Rd are ignored, a difference between the sum of voltages of the first capacitor Cd1 and the second capacitor Cd2 and the voltage spike value Spike point of the power switch is only a forward turn-on voltage drop of the diode Dd.

3. During stage C, the first capacitor Cd1, and the second capacitor Cd2 are continuously discharged by the discharge resistor Rd.

As compared to the embodiment of FIG. 15, the embodiment of FIG. 19 cannot correct the proportional coefficient of the first capacitor Cd1 and the second capacitor Cd2. Therefore, an initial deviation and temperature drift characteristics of the first capacitor Cd1 and the second capacitor Cd2 and discharge effect of the discharge resistor Rd influence accuracy of measurement results of the voltage spike in the embodiment of FIG. 19.

Figure 21:
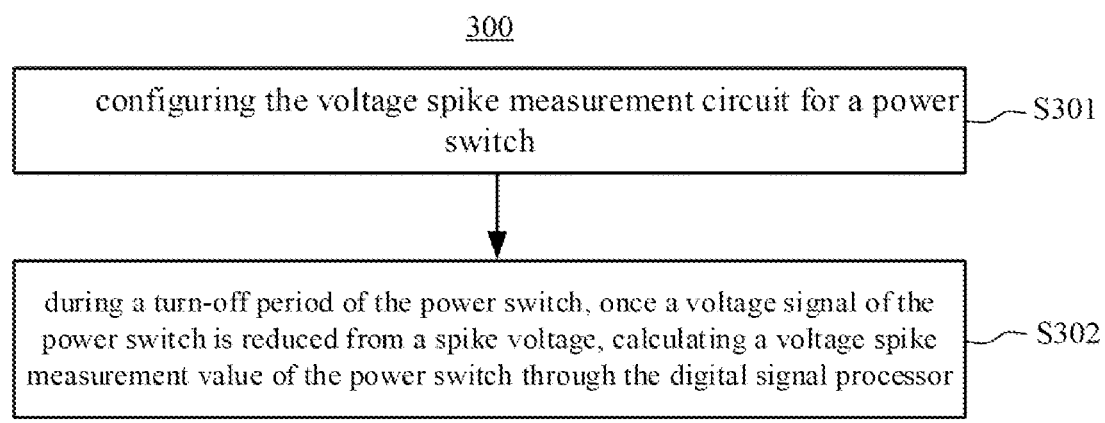
FIG. 21 is a flow diagram of a voltage spike measurement method for a power switch according to the disclosure.

As shown in FIG. 21, the disclosure further provides a voltage spike measurement method 300 for a power switch, mainly including:

S301, configuring the voltage spike measurement circuit for a power switch;

S302, during a turn-off period of the power switch, once a voltage signal at both ends of the power switch is reduced from a voltage spike, calculating a voltage spike measurement value of the power switch through the digital signal processor.

In the disclosure, referring to FIG. 15, the voltage spike measurement method 300 for a power switch may further include: turning on the first switch Qnmos at a first preset time, such that the capacitive divider unit 192 is discharged through the discharge unit 194; and turning off the first switch Qnmos at a second preset time, thereby preventing the discharge unit 194 from discharging the capacitive divider unit 192, and holding a high platform voltage on the capacitive divider unit 192.

On the premise of ensuring voltage stress on the power switch not to exceed a limit, the startup control method and system for a DC/DC converter in the disclosure can improve a reverse charging power to the maximum extent and reduce time desired for charging a bus capacitor when started reversely, and can accurately pre-charge the clamping capacitor when started forwardly.

The voltage spike measurement circuit and measurement method for a power switch in the disclosure detects voltage stress on the power switch through a capacitive divider. As compared to the traditional resistance voltage divider, the capacitive divider has characteristics of fast response speed, low loss, and strong resistance to interference. In the disclosure, by dividing the voltage at both ends of the power switch based on a relation of the capacitance ratio then sending the dividing signal to a digital signal processor for measurement, the capacitive divider does not need an additional RC circuit for filter.

Exemplary embodiments of the disclosure have been shown and described in detail. It shall be understood that the disclosure is not limited to the disclosed embodiments. Instead, the disclosure intends to cover various modifications and equivalent settings included in the spirit and scope of the appended claims.

What is claimed is:

1. A voltage spike measurement circuit for a power switch, comprising:
   a rectifier unit configured to receive a voltage signal at both ends of the power switch and output a rectified signal;
   a capacitive divider unit comprising at least two capacitors connected in series and configured to receive the rectified signal, divide the rectified signal based on a capacitance ratio of the at least two capacitors, and output a divider signal to a digital signal processor to calculate a voltage spike measurement value of the power switch; and
   a discharge unit connected in parallel to the capacitive divider unit;
   wherein the discharge unit comprises two discharge resistors connected in series, and a connection node of the two discharge resistors is further connected to a connection node of a first capacitor and a second capacitor of the at least two capacitors;
   during a turn-off period of the power switch, when the voltage signal of the power switch is reduced from a spike voltage, calculating the voltage spike measurement value of the power switch by the digital signal processor.

2. The voltage spike measurement circuit according to claim 1, wherein
   the rectifier unit comprises a rectifier diode, and the voltage signal of the power switch is input from an anode of the rectifier diode.

3. The voltage spike measurement circuit according to claim 1, wherein
   the capacitive divider unit comprises the first capacitor and the second capacitor of the at least two capacitors connected in series, and the divider signal is output from both ends of the second capacitor.

4. The voltage spike measurement circuit according to claim 1, wherein
   the discharge unit further comprises a first switch connected in series to the two discharge resistors, and a control end of the first switch is further connected to the digital signal processor.

5. A voltage spike measurement method for a power switch, comprising:
   configuring a voltage spike measurement circuit for the power switch, the voltage spike measurement circuit for the power switch, comprising:
   a rectifier unit configured to receive a voltage signal at both ends of the power switch and output a rectified signal;
   a capacitive divider unit comprising at least two capacitors connected in series and configured to receive the rectified signal, divide the rectified signal based on a capacitance ratio of the at least two capacitors, and output a divider signal to a digital signal processor to calculate a voltage spike measurement value of the power switch; and
   a discharge unit connected in parallel to the capacitive divider unit;
   during a turn-off period of the power switch, when the voltage signal of the power switch is reduced from a spike voltage, calculating the voltage spike measurement value of the power switch by the digital signal processor,
   wherein the discharge unit comprises at least one discharge resistor and a first switch connected in series to the at least one discharge resistor, wherein a control end of the first switch is further connected to the digital signal processor, and the voltage spike measurement method further comprising:
   turning on the first switch at a first preset time, such that the capacitive divider unit is discharged through the discharge unit; and
   turning off the first switch at a second preset time.

* * * * *